(12) United States Patent
Mori et al.

(10) Patent No.: US 8,884,678 B2
(45) Date of Patent: Nov. 11, 2014

(54) POWER LINE CARRIER COMMUNICATION RECEPTION CIRCUIT

(71) Applicant: RiB Laboratory, Inc., Ritto (JP)

(72) Inventors: Setsuro Mori, Ritto (JP); Shohei Terada, Wako (JP); Motoki Kono, Wako (JP)

(73) Assignees: RiB Laboratory, Inc., Ritto, Shiga Prefecture (JP); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 14/157,912

(22) Filed: Jan. 17, 2014

(65) Prior Publication Data

US 2014/0210540 A1    Jul. 31, 2014

(30) Foreign Application Priority Data

Jan. 28, 2013    (JP) ................. 2013-013221

(51) Int. Cl.
    *H03K 5/08*    (2006.01)
    *H03L 5/00*    (2006.01)

(52) U.S. Cl.
    CPC ..................... *H03K 5/08* (2013.01)
    USPC .............. 327/312; 327/321; 327/309

(58) Field of Classification Search
    USPC .......................... 327/306, 309–321
    See application file for complete search history.

(56) References Cited

U.S. PATENT DOCUMENTS 4,149,157 A * 4/1979 Guennou ................. 340/554
5,631,891 A * 5/1997 Moritsugu et al. ....... 369/124.11

FOREIGN PATENT DOCUMENTS

JP    2003-218831 A    7/2003

* cited by examiner

*Primary Examiner* — Dinh Le
(74) *Attorney, Agent, or Firm* — Novick, Kim & Lee, PLLC; Jae Youn Kim

(57) ABSTRACT

A power line carrier communication reception circuit which can precisely receive a signal to be superimposed at such a signal level that leakage of an electromagnetic wave does not cause a problem while employing a simplified configuration is provided.

The power line carrier communication reception circuit may include an amplifier which is connected to a power line and amplifies a received signal to be superimposed on the power line; two capacitors which are connected in series between both power sources of the amplifier; and a clipper circuit which connects connection points of these capacitors to the power line and limits the received signal in a predetermined range of a reference voltage between the capacitors, and in which the amplifier compares the signal limited by the clipper circuit and the reference voltage and amplifies the signal.

4 Claims, 5 Drawing Sheets

POWER LINE CARRIER COMMUNICATION RECEPTION CIRCUIT

BACKGROUND OF THE INVENTION

1. Field of the Invention

The present invention relates to a power line carrier communication reception circuit.

2. Description of the Related Art

Conventionally, power line carrier communication which uses a power line as a communication line is performed. A power line carrier communication apparatus is an apparatus which performs such communication using a power line, and can perform data communication between each power line carrier communication reception circuit connected by the power line.

While there are various schemes of power line carrier communication, there are roughly carrier band transmission for modulating data to be communicated using a carrier wave of several Hz to several tens of MHz as a carrier, and baseband transmission which does not use a carrier wave. The carrier baseband transmission can not only perform communication which is hardly influenced by noise in the surrounding by selecting a frequency of a carrier wave but also further prevent communication from being influenced by noise by using a plurality of carrier waves in combination, and therefore is used for communication in many apparatuses.

Japanese Patent No. 3931666 discloses a power line carrier communication reception circuit which is configured to suppress the amount of power consumption as much as possible in carrier band transmission which uses a plurality of carrier waves in combination.

SUMMARY OF THE INVENTION

However, it is necessary to process signals whose number corresponds to the number of frequency bands of carrier waves to be used since a plurality of carrier waves is used for the above carrier band transmission, and therefore there is a problem that multiple elements are required and thereby increase manufacturing cost. In addition, frequencies of carrier waves are set sufficiently high compared to a bit rate of data to be communicated, and therefore there is also a problem that elements which operate at a high speed are required, and thereby increase manufacturing cost.

On the other hand, when baseband transmission is performed, a transmission signal is superimposed on a power line which feeds power, and therefore since transmission efficiency of a signal is poor compared to communication which uses a normal communication line and, above all, since an impedance of a power line is low, there is a problem that the transmission signal is distorted as if the transmission signal were subjected to a differential operation. Further, when a level of a signal to be transmitted is too high, this signal is likely to leak to a surrounding as an electromagnetic wave, and therefore, an input level of a signal to be received using a power line cannot help weakening, thereby making reception of the signal difficult.

In addition, when the reception circuit is used in a system in which a battery of a limited size is used to arrange the reception circuit in limited space as in a vehicle, there is a problem that an error occurs upon quantization of a received signal due to a significant fluctuation of a power voltage in a power supply line following driving of a load. That is, when whether or not the received signal is high or low is determined based on whether or not the received signal exceeds a predetermined reference threshold, a fluctuation of a power voltage significantly influences the received signal and causes an error of the received signal.

The present invention is made in light of the above matter, and an object of the present invention is to provide a power line carrier communication reception circuit which can precisely receive a signal to be superimposed at such a signal level that leakage of an electromagnetic wave does not cause a problem while employing a simplified configuration which uses baseband communication, and which is robust against a fluctuation of a power voltage.

To solve the above problem, the first aspect of the present invention provides a power line carrier communication reception circuit including an amplifier which is connected to a power line and amplifies a received signal to be superimposed on the power line; two capacitors which are connected in series between both power sources of the amplifier; and a clipper circuit which connects connection points of these capacitors to the power line and limits the received signal in a predetermined range from a reference voltage between the capacitors, and in which the amplifier compares the signal limited by the clipper circuit and the reference voltage and amplifies the signal.

In the power line carrier communication reception circuit, although the connection points of the two capacitors connected in series between the power sources of the amplifier serve as the reference voltage, the connection points are connected to the power line through the clipper circuit and therefore are adequately adjusted to follow a voltage to be supplied to the power line or a voltage of the received signal. In addition, preferably, a reception resistance which adjusts a speed to have the reference voltage follow a change of the voltage and receives a signal is interposed at the connection portion of the power line and the clipper circuit.

Further, the amplifier compares the received signal and the adequately adjusted reference voltage, and amplifies the received signal at around the reference voltage. That is, although the impedance of the power line is low, and therefore when a signal is transmitted to this power line, a signal which has a square wave upon transmission and which is received through the power line becomes a distorted signal as if a waveform of the transmission wave were subjected to a differential operation, even when the received signal has a distorted waveform as if the received signal were subjected to a differential operation and even when the received signal includes noise in a range of a potential difference limited by the clipper circuit, a signal can be correctly received without being influenced by the noise due to clipping performed by the clipper circuit and following of the reference voltage.

In addition, although at least two capacitors are provided to generate an intermediate reference voltage between the power sources, it goes without saying that this is a configuration of generating the intermediate reference voltage between the power sources of the amplifier and by no means limits the number of capacitors, and three or more capacitors may be combined.

In addition, what is preferable is that the clipper circuit clips the received signal at a little potential difference to make it easy for the reference voltage to follow the voltage of the power line. Meanwhile, what is preferable is that, when the clipper circuit performs clipping at a great potential difference, it is possible to reduce an influence of external noise. When, for example, the potential difference of this clipping is 0.4 mV, the clipper circuit operates with a good balance and the clipper circuit in this case can be formed with Schottky barrier diodes which are mutually connected in the opposite direction.

Further, a frequency of a received signal upon baseband communication supported by the amplifier is not high, so that the amplifier does not need to operate at a high speed and thereby a cheaper element can be used therefor.

When the amplifier is a differential amplifier which performs positive feedback amplification, the output of the amplifier at around the reference voltage can be easily shaped such that the received signal is saturated in an output range of the differential amplifier and is outputted as a square wave. It is possible to form a reception circuit which supports a speed to follow a change of a signal upon baseband communication, using a general-purpose differential amplifier which can be manufactured at low cost and, contribute to reduction of manufacturing cost of entire power line carrier communication apparatuses.

In addition, when a power line is a power supply line which supplies a current from a battery of a vehicle to a predetermined load and the received signal is a control signal which controls the load, and even when the reception circuit is used in a system in which a battery of a limited size is used to arrange this reception circuit in a limited space as in a vehicle, if a power voltage in the power supply line significantly fluctuates following driving of a load, whether the received signal is high or low is determined based on a reference voltage which is fluctuated by the clipper circuit following the fluctuation of the power voltage, so that reception error hardly occurs.

As described above, the present invention can reliably receive a signal to be superimposed on a power line using a switching element switched at a comparatively low speed and reduce manufacturing cost accordingly. Further, the operation is stable, so that the present invention can minimize an influence of external noise.

DETAILED DESCRIPTION OF THE INVENTION

Figure 1:
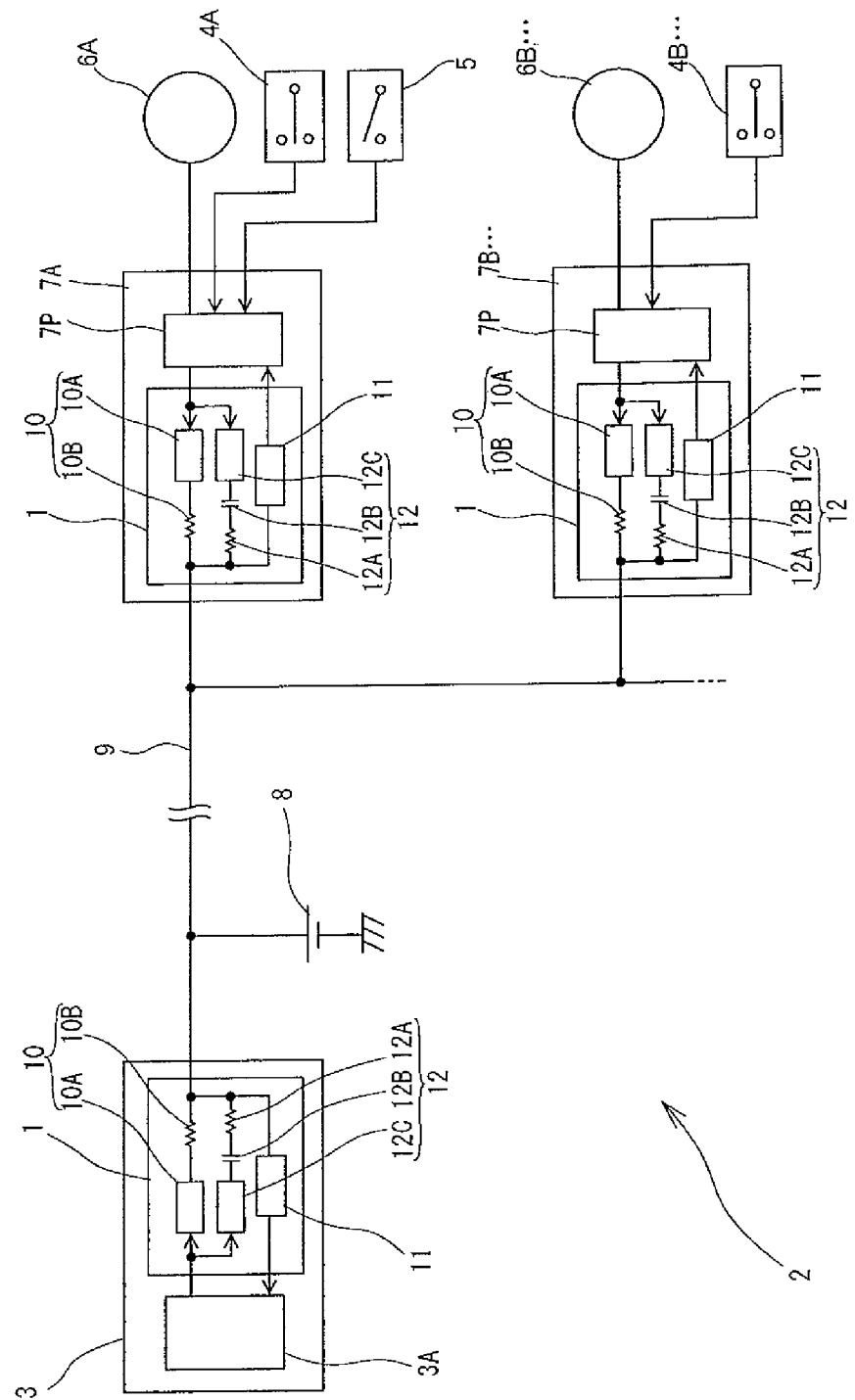
FIG. 1 is a view illustrating an example of a communication system which includes power line carrier communication reception circuits according to a first embodiment of the present invention.

A power line carrier communication reception circuit 11 according to a first embodiment of the present invention will be described below using FIGS. 1 and 2. As illustrated in FIG. 1, the power line carrier communication reception circuit 11 according to the present invention is used as a main unit of a communication system 2 of a vehicle.

The communication system 2 illustrated in FIG. 1 has: an electronic control unit (ECU) 3 which performs communication with, for example, each electrical device provided at each door of the vehicle; power window switches 4A, 4B . . . which are provided at the doors of the vehicle and operate windows to open and close; a window lock switch 5 which is provided at a door on a driver's seat side and forbids an operation of opening and closing the windows other than a window of the driver's seat; motors 6A, 6B . . . which are driving sources of power to open and close the windows; a contact point information collecting apparatus 7A which is connected to the electrical devices 4A, 5 and 6A on the driver's seat side and inputs and outputs contact point information; contact point information collecting apparatuses 7B . . . which are connected to the electrical devices 4B, . . . , 6B . . . provided at the other doors and input and output contact point information; and a power line 9 which supplies power from a battery 8.

Further, the power line 9 not only transmits power but also functions as a signal line which connects the ECU 3 to the contact point information collecting apparatuses 7A, 7B . . . and performs power line carrier communication. In addition, in the following description, when the members 4A, 4B, . . . , 6A, 6B, . . . , 7A, 7B . . . do not need to be distinguished, the members will be simply described using reference numerals 4, 6 and 7.

The ECU 3 and the contact point information collecting apparatus 7A, 7B . . . have the power line carrier communication apparatuses 1 at connection portions with the power line 9. The power line carrier communication apparatus 1 has: a transmission circuit 10 which is connected to the power line 9 and which transmits a signal to the power line 9; a power line carrier communication reception circuit 11 (also referred to simply as the reception circuit 11) according to the present invention which is connected to the power line 9 and which receives the signal from the power line 9; and an output suppression circuit 12 which is connected to the power line 9 and which suppresses an output of the signal transmitted from the transmission circuit 10.

The transmission circuit 10 has an amplification circuit 10A and an output resistance 10B, and the output suppression circuit 12 has a voltage dividing resistance 12A which is an example of a signal attenuating element whose one end is connected between the output resistance 10B and the power line 9, a capacitor 12B which is connected to the voltage dividing resistance 12A and blocks a direct current component, and a switching circuit 12C which connects the other end of this capacitor 12B to a common (an earth common in case of a vehicle).

In addition, a CPU 3A in the ECU 3 performs computation processing of monitoring contact point information of the electrical devices 4A, 4B, . . . and 5 and outputting the contact point information for controlling the motors 6A, 6B . . . , and the contact point information collecting apparatuses 7A, 7B . . . have input/output units 7P which transmit and receive the contact point information to and from the CPU 3A, output the contact point information to the motors 6A, 6B . . . and receive an input of the contact point information from the switches 4A and 4B.

Figure 2:
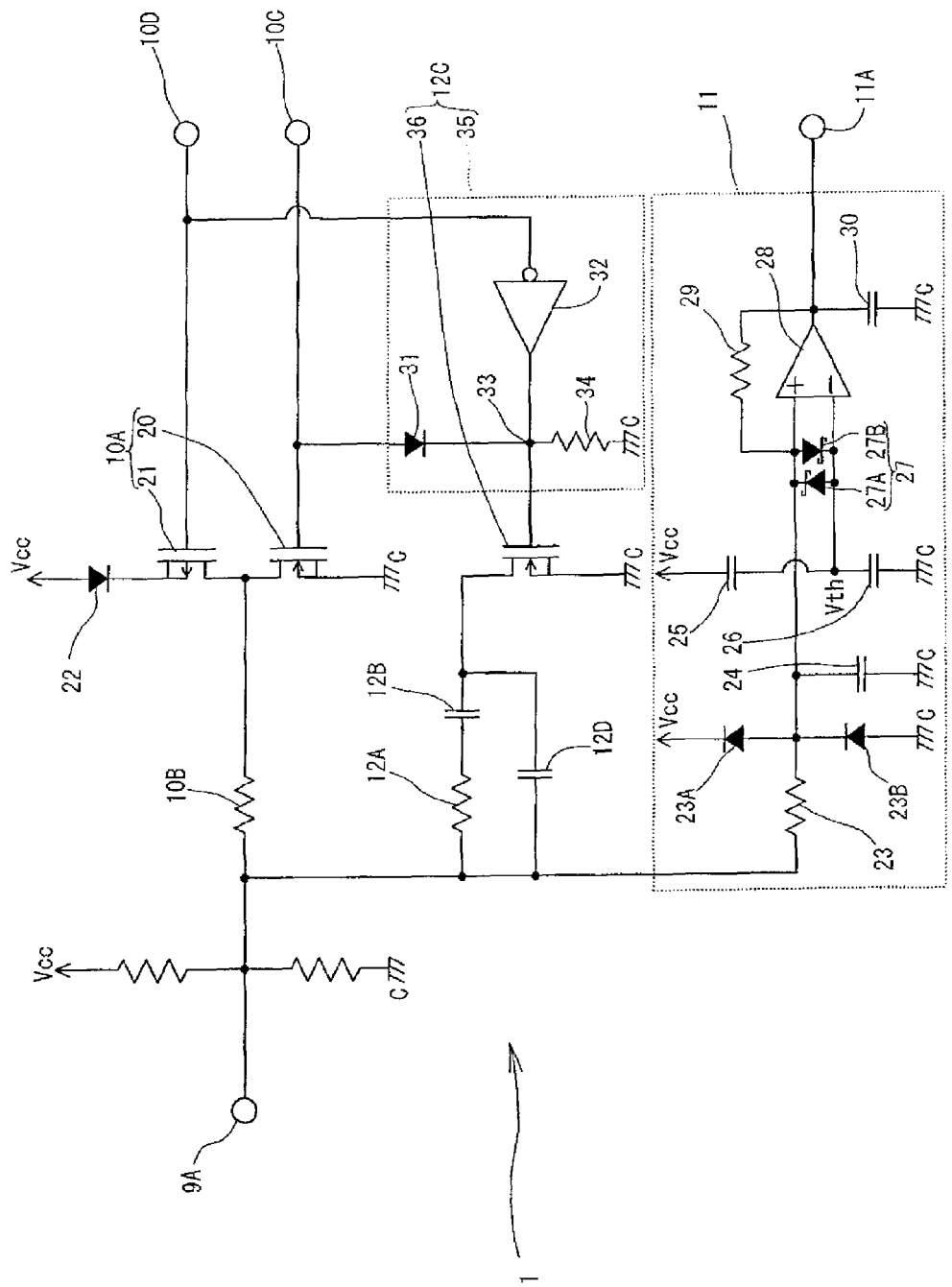
FIG. 2 is a view illustrating in detail a configuration of a power line carrier communication apparatus which includes the power line carrier communication reception circuit illustrated in FIG. 1.

FIG. 2 is a view illustrating in detail a configuration of the power line carrier communication apparatus 1. As illustrated in FIG. 2, the transmission circuit 10, the reception circuit 11 and the output suppression circuit 12 adopt plus power sources Vcc of the CPU 3A or the input/output units 7P as plus power sources which are formed according to signal levels of the CPU 3A or the input/output units 7P connected to the transmission circuit 10, the reception circuit 11 and the output suppression circuit 12, and adopt a common earth common C as a minus power source for the CPU 3A or the input/output units 7P.

The amplification circuit 10A of the transmission circuit 10 is formed with MOS type FETs 20 and 21 of a N channel and a P channel, is formed by connecting a source of the FET 20 to the minus power source C, a source of the FET 21 to a plus power source Vcc and a drain of the FET 20 to a drain of the FET 21 as indicated in FIG. 2, and receives an input of A phase and B phase signals of opposite phases to be transmitted to gates of these FETs 20 and 21 as input unit signals, and, consequently, can generate a transmission signal which sets power voltage levels of the power sources Vcc and C to a high level and a low level to output the transmission signal to a power line connection portion 9A to which the power line 9 is connected through the output resistance 10B. In addition, a diode 22 prevents a backflow.

The reception circuit 11 has: an input resistance 23 which is connected to the power line connection portion 9A; a capacitor 24 which cancels high frequency noise and has low capacity; two capacitors 25 and 26 which are connected in series between the power sources Vcc and C; a clipper circuit 27 which connects the connection points of these capacitors 25 and 26 to the power line 9 through the input resistance 23, and limits a received signal in a predetermined range of a reference voltage Vth between the capacitors; an operation amplifier (which is an example of a differential amplifier and is referred to as an OP amplifier below) 28 which amplifies the signal limited by the clipper circuit 27 using the reference voltage Vth as a threshold; a positive feedback resistance 29 which provides a positive feedback of the output of this OP amplifier 28 to a non-inverting input terminal of the OP amplifier; and a capacitor 30 which stabilizes the output and has low capacity.

In addition, backflow prevention diodes 23A and 23B are provided on a secondary side of the input resistance 23, and an output unit 11A outputs a signal generated as a square wave by the reception circuit 11.

The clipper circuit 27 has Schottky barrier diodes 27A and 27B which are connected in parallel in opposite directions, and can clip an input signal by these diodes such that a potential difference between an inverting input terminal and the non-inverting input terminal of the OP amplifier is suppressed to about 0.4 V of forward drop voltages of the Schottky barrier diodes 27A and 27B.

Further, when the voltage of the power line 9 fluctuates due to a state of a vehicle, and when the potential difference exceeds the forward drop voltages of the Schottky barrier diodes 27A and 27B, a current flows between the capacitors 25 and 26 through the clipper circuit 27, so that it is possible to automatically adjust the reference voltage Vth between the capacitors 25 and 26 according to a current state. By contrast with this, in a range of the drop voltage of the clipper circuit 27, even when noise is added to a voltage on the secondary side of the reception resistance 23, an error of a received signal due to this noise is not produced.

That is, by adequately adjusting constants of the members 23 to 30 according to environment such as the length and the impedance of the power line 9 used for signal communication, even baseband transmission can perform communication which is hardly influenced by noise.

Even though the waveform of a signal to be transmitted through the power line 9 is a square wave upon transmission, the waveform is usually significantly deformed upon reception and, above all, when a signal is superimposed on the power line 9 of the low impedance, the waveform is deformed as if the waveform were subjected to the differential operation. However, the clipper circuit 27 suppresses the reference voltage Vth±forward drop voltage and the OP amplifier performs positive feedback amplification, so that it is possible to effectively reproduce the original square wave even on the reception side.

The switching circuit 12C of the output suppression circuit 12 has: a diode 31 which is connected to an input unit 10C of the A phase signal; an inversion circuit 32 which is connected to the input unit 10D of the B phase signal; a switch control unit 35 which is formed with a resistance 34 connected to a connection point 33 of the diode and the inversion circuit; and a FET 36 (switching element) of a n channel whose gate is connected to the connection point 33. The switching circuit 12C which is configured as described above performs switching such that the switching circuit is placed in an on state only when a transmission signal is transmitted, and the source of the FET 36 is connected to an earth common C.

Consequently, a voltage dividing resistance 12A connected to a drain of the FET 36 is connected to the earth common C through the capacitor 12B only when a transmission signal is outputted. In addition, a capacitor 12D is connected in parallel to the voltage dividing resistance 12A and the capacitor 12B connected in series, and, by this means, the high frequency component can flow to the earth common C without passing through the voltage dividing resistance 12A. In addition, a ratio of sizes of the output resistance 10B and the voltage dividing resistance 12B influences the degree of output suppression, and is adjusted according to the length or the magnitude of the impedance of the power line 9 used to transmit and receive a signal.

Figure 3:
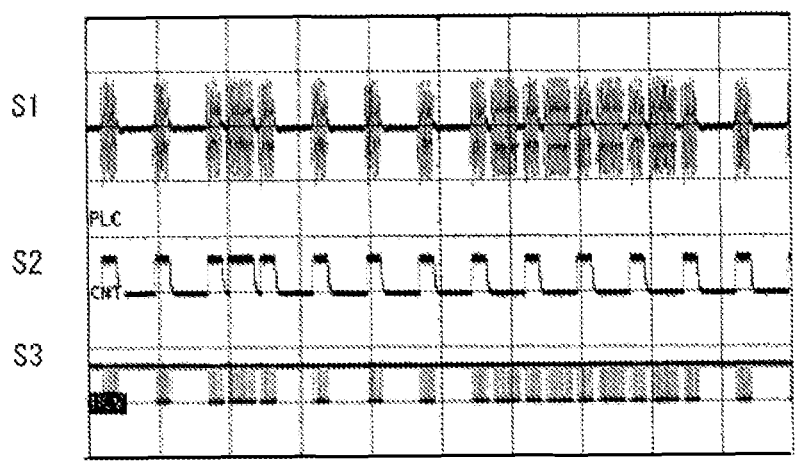
FIG. 3 is a view explaining an operation of the power line carrier communication apparatus.
Figure 4:
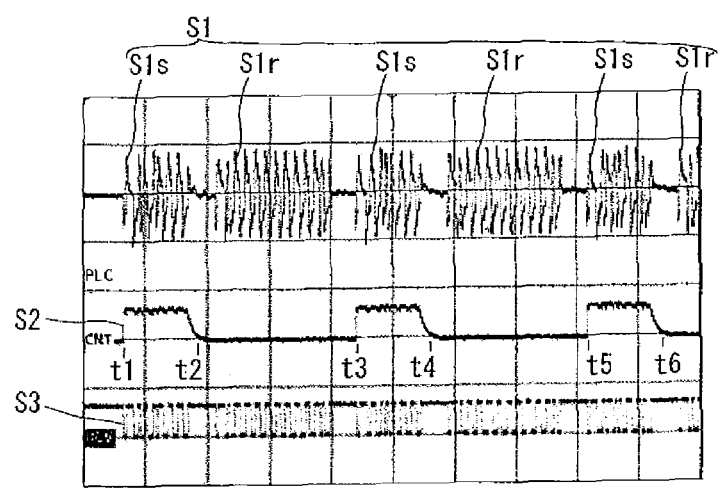
FIG. 4 is another view explaining the operation of the power line carrier communication apparatus.
Figure 5:
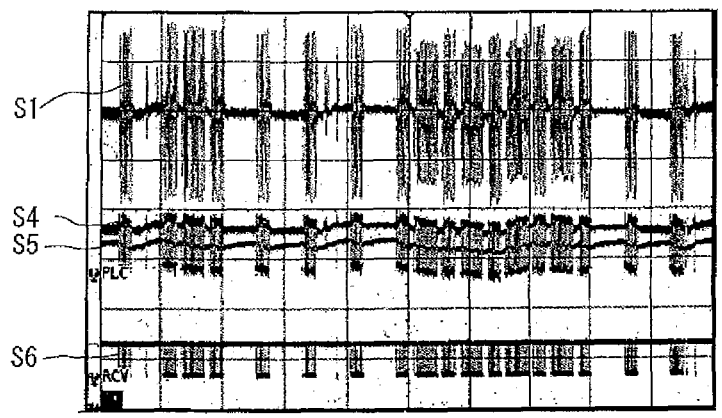
FIG. 5 is a view explaining the operation of the power line carrier communication reception circuit.
Figure 6:
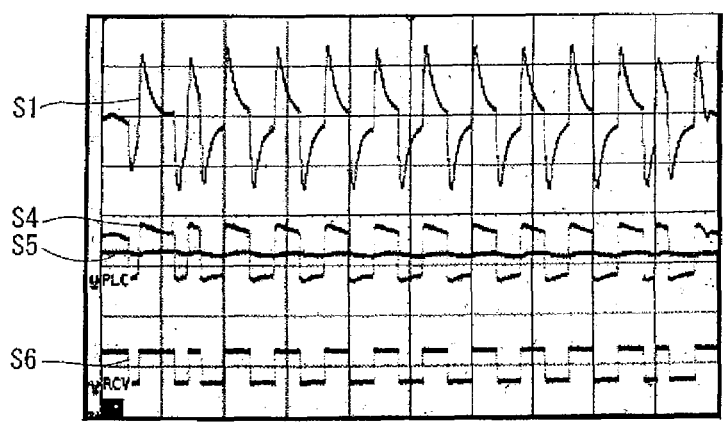
FIG. 6 is another view explaining the operation of the power line carrier communication reception circuit.

FIGS. 3 to 6 are views illustrating examples where the operation of the power line carrier communication apparatus 1 employing the above configuration is actually measured, and FIGS. 3 and 4 explain operations of the transmission circuit 10 and the output suppression circuit 12 and FIGS. 5 and 6 explain the operation of the power line carrier communication reception circuit 11 according to the present invention.

A signal S1 illustrated in FIGS. 3 and 4 is superimposed on the power line, and includes both of a transmission signal S1*s* to be transmitted to the power line 9 through the power line connection portion 9A and a received signal S1*r* received from the power line 9. A switch signal S2 indicates a voltage at the connection point 33 and this switch signal S2 is an on/off signal of the switching element 36. A received signal S3 is received by the reception circuit 11, and is outputted to the output unit 11A.

Since the switching circuit 12C enters an on state only when outputs of the diode 31 and the inversion circuit 32 are at high levels (during times t1 to t2, t3 to t4 and t5 to t6 illustrated in FIG. 4), the switching signal 12C continues to be on at all times while the input units 10C and 10D receive inputs of the A phase and B phase transmission signals and the transmission signals are outputted. Consequently, the output of the amplification circuit 10A is earthed to the earth common C through the output resistance 10B, the voltage dividing resistance 12A and the switching element 36, so that the output signal is attenuated by dividing the voltage by resistance values of the output resistance 10B and the voltage dividing resistance 12A and is transmitted to the power line 9.

On the other hand, when the received signal S1*r* is received, the switch signal S1 becomes off, and therefore the voltage dividing resistance 12A is not earthed to the earth common C and the received signal S1*r* inputted through the power line connection portion 9A is not attenuated by the voltage dividing resistance 12A. Switching between transmission and reception of this signal is clearly distinguished when communication according to a token passing method is performed, and a transmission timing of the power line carrier communication apparatus is known, so that it is possible to reliably switch on and off of the switching element 36.

The operation is performed as described above, so that the intensity of the transmission signal S1*s* supplied to the power line 9 is substantially the same as the intensity of the received signal S1r received from the power line 9. That is, even in environment in which a leakage flux is likely to be produced from the power line 9, it is possible to easily suppress an output to such a degree that the leakage flux as an electromagnetic wave does not negatively influence external devices.

Further, it is not necessary to use a switching element which supports a high speed operation as in the case of using carrier waves (carrier) of a high frequency for every member which forms the power line carrier communication reception circuit 11, so that it is possible to reduce manufacturing cost accordingly.

Next, a received signal S4 illustrated in FIGS. 5 and 6 is on the secondary side of the reception resistance 23, a signal S5 indicates a voltage fluctuation of the reference voltage Vth and a received signal S6 is a signal which is received and shaped into a square wave.

As illustrated in FIG. 5, the reference voltage which is determined by the capacitors 25 and 26 (see FIG. 2) can fluctuate when the voltage to be supplied to the power line 9 fluctuates to follow the change of the voltage. That is, the reference voltage Vth is automatically adjusted according to a current power voltage supplied to the power line 9, and serves as an operating point of the OP amplifier 28.

Further, the magnitude of the reception resistance 23 influences a speed of the reference voltage Vth to follow the voltage of the power line 9 and the received signal Sir received through the reception resistance 23 is limited in the range of about ±0.4 V of the reference voltage Vth similar to the signal S4. Therefore, the magnitude of the reception resistance 23 and a range of the voltage to be limited by the clipper circuit 27 are adequately selected according to the magnitude of noise which contaminates the signal line 9 or a voltage fluctuation.

Next, the output of the OP amplifier 28 rises or falls to the same degree as that of the plus and minus power voltages Vcc and C depending on the received signal, and is saturated. That is, the output of the reception circuit 11 becomes a substantially square wave.

Although, as is obvious from FIG. 6, when the power line 9 of a low impedance is used for power superimposition of baseband transmission, the signal S1s to be transmitted is distorted as if the signal were subjected to a differential operation, it is possible to shape the output waveform of the reception circuit 11 into the same square wave as that upon transmission and perform communication with less error.

What is claimed is:

1. A power line carrier communication reception circuit comprising:
   an amplifier which is connected to a power line and amplifies a received signal to be superimposed on the power line;
   two capacitors which are connected in series between both power sources of the amplifier; and
   a clipper circuit which connects connection points of the two capacitors to the power line and limits the received signal in a predetermined range from a reference voltage between the two capacitors, wherein the amplifier compares the signal limited by the clipper circuit and the reference voltage and amplifies the signal.

2. The power line carrier communication reception circuit according to claim 1, wherein the amplifier is a differential amplifier which performs positive feedback amplification.

3. The power line carrier communication reception circuit according to claim 1, wherein the power line is a power supply line which supplies a current from a battery of a vehicle to a predetermined load and the received signal is a control signal which controls the load.

4. The power line carrier communication reception circuit according to claim 2, wherein the power line is a power supply line which supplies a current from a battery of a vehicle to a predetermined load and the received signal is a control signal which controls the load.

* * * * *